United States Patent
Lee

(10) Patent No.: US 9,583,308 B1
(45) Date of Patent: Feb. 28, 2017

(54) LIGHT BATH FOR PARTICLE SUPPRESSION

(71) Applicant: Varian Semiconductor Equipment Associates, Inc., Gloucester, MA (US)

(72) Inventor: William Davis Lee, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/837,610

(22) Filed: Aug. 27, 2015

(51) Int. Cl.
 *H01J 37/317* (2006.01)
 *H01J 37/08* (2006.01)
 *H01J 37/147* (2006.01)

(52) U.S. Cl.
 CPC .......... *H01J 37/3171* (2013.01); *H01J 37/08* (2013.01); *H01J 37/1472* (2013.01); *H01J 2237/0815* (2013.01); *H01J 2237/31701* (2013.01); *H01J 2237/31705* (2013.01)

(58) Field of Classification Search
 CPC ..................... H01J 37/3171; H01J 2237/31701
 See application file for complete search history.

(56) References Cited

U.S. PATENT DOCUMENTS

| | | | |
|---|---|---|---|
| 6,616,987 B1 | 9/2003 | Morfill et al. | |
| 7,851,773 B2* | 12/2010 | Glavish | H01J 37/05 250/281 |
| 8,519,353 B2* | 8/2013 | Radovanov | H01J 37/12 250/396 R |
| 8,841,607 B2* | 9/2014 | Yang | H01J 49/044 250/282 |
| 2010/0019141 A1* | 1/2010 | Olson | H01J 37/304 250/282 |

* cited by examiner

*Primary Examiner* — Jack Berman

(57) ABSTRACT

An apparatus, referred to as a light bath, is disposed in a beamline ion implantation system and is used to photoionize particles in the ion beam into positively charged particles. Once positively charged, these particles can be manipulated by the various components in the beamline ion implantation system. In certain embodiments, a positively biased electrode is disposed downstream from the light bath to repel the formerly non-positively charged particles away from the workpiece. In certain embodiments, the light bath is disposed within an existing component in the beamline ion implantation system, such as a deceleration stage or a Vertical Electrostatic Energy Filter. The light source emits light at a wavelength sufficiently short so as to ionize the non-positively charged particles. In certain embodiments, the wavelength is less than 250 nm.

19 Claims, 4 Drawing Sheets

LIGHT BATH FOR PARTICLE SUPPRESSION

Embodiments of the present disclosure relate to an apparatus for particle suppression, and more particularly, an apparatus to impart a positive charge on particles so that the particles may be controlled by an electric or magnetic field within a beamline ion implantation system in a known and quantifiable way.

BACKGROUND

Improvement in yields for semiconductor devices is a continuous goal. One area that may be improved is the unintentional implanting of particles into the workpiece. In traditional beam line ion implantation equipment, electrical and magnetic fields are used to control the velocity and trajectory of ions as the ions travel through the system. For example, ions that do not have the desired mass/charge ratio may be screened before these unwanted ions implant the workpiece.

However, neutral particles, or particles with negative charge, are oblivious to or not effectively controlled by, these fields, and therefore cannot be controlled using traditional techniques. Consequently, these neutral or negatively charged particles may be transported through an ion beam line, and may be implanted in the workpiece, resulting in damage to devices and yield loss. These neutral particles may be caused by sputtering of the equipment in the beam line.

Conventional approaches to the issue of particle contamination have been to attempt to reduce the generation of these particles. For example, liners may be installed in the path of the beam to minimize sputtering. Additionally, these liners may be constructed from graphite, because of the assumption that carbon particles are not detrimental, or are less detrimental, to the workpiece. However, eliminating all particles may not be feasible, or even possible.

Therefore, an apparatus that can reduce the number of particles that impact a workpiece would be beneficial. Further, it would be advantageous if the apparatus cooperated with the existing techniques and mechanisms for controlling the velocity and trajectory of ions to be implanted.

SUMMARY

An apparatus, referred to as a light bath, is disposed in a beamline ion implantation system and is used to photoionize particles in the ion beam into positively charged particles. Once positively charged, these particles can be manipulated by the various components in the beamline ion implantation system. In certain embodiments, a positively biased electrode is disposed downstream from the light bath to repel the formerly neutral, or negatively charged, particles away from the workpiece. In certain embodiments, the light bath is disposed within an existing component in the beamline ion implantation system, such as a deceleration stage or a Vertical Electrostatic Energy Filter. The light source emits light at a wavelength sufficiently short so as to ionize the particles. In certain embodiments, the wavelength is less than 250 nm.

According to one embodiment, an apparatus for reducing an amount of non-positively charged particles in an ion beam is disclosed. The apparatus comprises a light source, disposed on one side of the ion beam and emitting light at a wavelength sufficiently short so as to ionize non-positively charged particles into positively charged particles; and a positively biased electrode downstream from the light source, to repel the positively charged particles. In certain embodiments, the wavelength is less than 250 nm. In certain further embodiments, the wavelength is less than 200 nm. In certain embodiments, the apparatus further comprises a light sink to absorb light emitted by the light source. In some embodiments, the light sink is disposed on an opposite side of the ion beam from the light source. In certain embodiments, the non-positively charged particles comprise neutral particles. In certain embodiments, the non-positively charged particles comprise negatively charged particles.

According to another embodiment, a beamline ion implantation system is disclosed. The system comprises an ion source; a deceleration stage comprising a positively biased electrode; and a light bath disposed in the deceleration stage, the light bath comprising a light source, disposed upstream from the positively biased electrode, and emitting light at a wavelength sufficiently short so as to ionize non-positively charged particles into positively charged particles. In certain embodiments, the non-positively charged particles comprise silicon or carbon. In certain embodiments, the deceleration stage comprises a Vertical Electrostatic Energy Filter.

According to another embodiment, a beamline ion implantation system is disclosed. The system comprises an ion source; one or more components utilizing magnetic or electrical fields to manipulate an ion beam; and a light bath comprising a light source and emitting light at a wavelength sufficiently short so as to ionize non-positively charged particles in the ion beam into positively charged particles, so that the positively charged particles are manipulated by at least one of the one or more components. In certain embodiments, the positively charged particles are manipulated by a positive electrical field.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
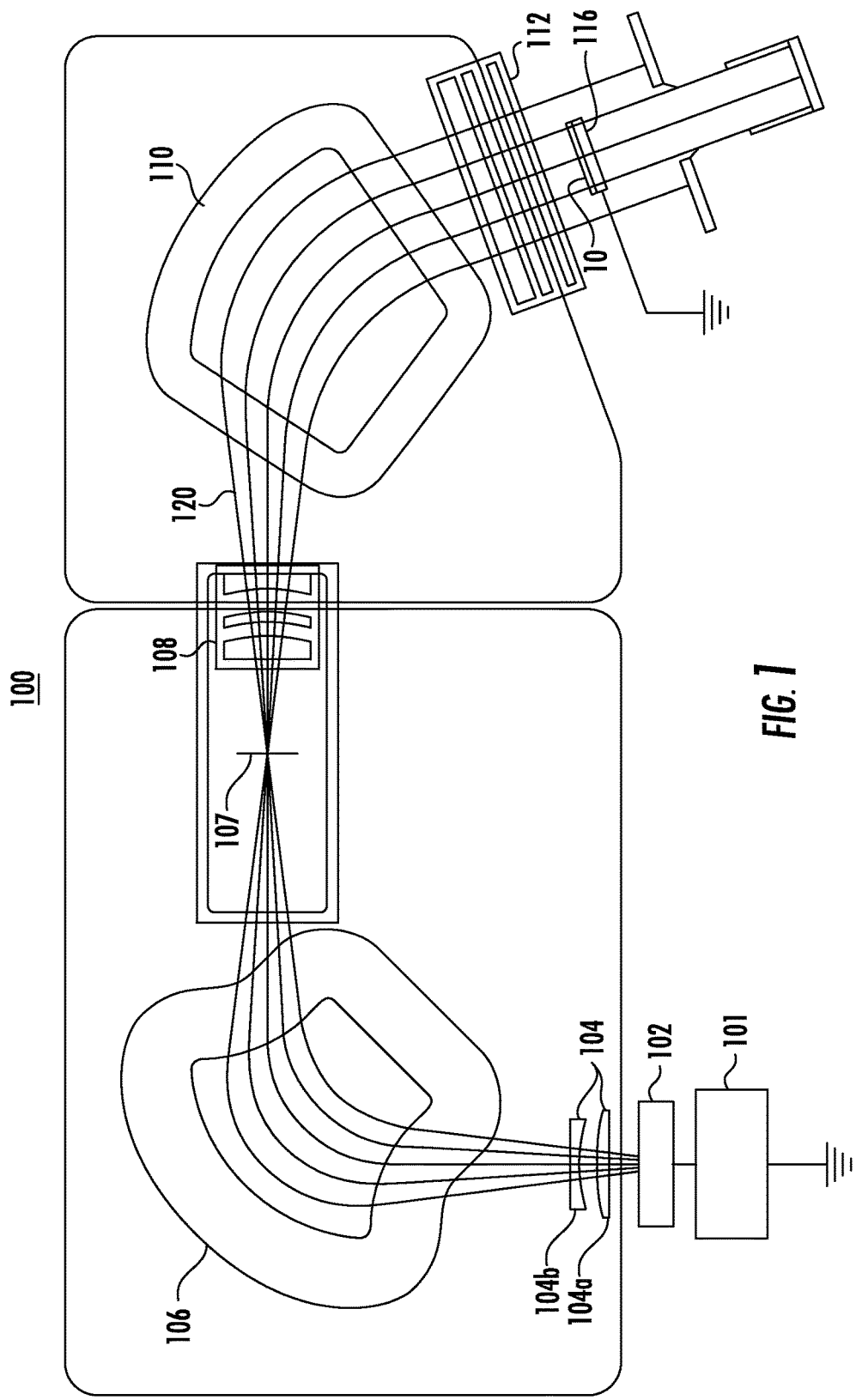
FIG. 1 is an ion implantation system in accordance with one embodiment.

FIG. 1 shows a beamline ion implantation system 100 that may be used to perform the implantation of ions into a workpiece. The apparatus to suppress particle implantation, also referred to as a light bath, may be coupled to or installed in the beamline ion implantation system 100, as described in more detail below.

As illustrated in the figure, the beamline ion implantation system 100 may comprise an ion source and a complex series of beam-line components through which an ion beam 120 passes. The ion source may comprise an ion source chamber 102 where ions are generated. The ion source may also comprise a power source 101 and an extraction electrode 104 disposed near the ion source chamber 102. The extraction electrodes 104 may include a suppression electrode 104a and a ground electrode 104b. Each of the ion source chamber 102, the suppression electrode 104a, and the ground electrode 104b may include an aperture. The ion source chamber 102 may include an extraction aperture (not shown), the suppression electrode may include a suppression electrode aperture (not shown), and a ground electrode may include a ground electrode aperture (not shown). The apertures may be in communication with one another so as to allow the ions generated in the ion source chamber 102 may pass through, toward the beam-line components.

The beamline components may include, for example, a mass analyzer 106, a first acceleration or deceleration (A1 or D1) stage 108, a collimator 110, and a second acceleration or deceleration (A2 or D2) stage 112. Much like a series of optical lenses that manipulate a light beam, the beamline components can filter, focus, and manipulate ions or ion beam 120. The ion beam 120 that passes through the beamline components may be directed toward the workpiece 10 that is mounted on a platen 116 or clamp. The workpiece 10 may be moved in one or more dimensions by an apparatus, sometimes referred to as a "roplat." The roplat may be configured to rotate the workpiece 10 about the center of the workpiece. Further, the roplat may be configured to move the workpiece 10 so that the ion beam 120 is directed to a specific region of the workpiece.

The mass analyzer 106 may include a magnet which creates a magnetic field that causes the ions to bend 90° and travel toward an aperture 107. The radius traversed by an ion is determined based on its mass and the force exerted on that ion by the magnetic field. This force is proportional to the charge on the ion. Therefore, the ratio of the mass of the ion to its charge determines the path traversed by an ion. Ions of an unwanted species, which may have a different mass to charge ratio, travel in a path which may not lead to the aperture 107. In this way, unwanted ions are removed from the ion beam 120.

The acceleration or deceleration stages operate by supplying a voltage to electrodes disposed within the stages. An electrode with a positive voltage tends to slow or decelerate the positive ions, as the positive ions are repelled by the positively charged electrodes. Conversely, an electrode with a negative voltage tends to attract or accelerate the positive ions.

Neutral particles may be generated when ions strike the beamline components. These neutral particles may be thousands or even millions or more of atoms that are clustered together. In certain embodiments, energetic ions may strike the liners or walls of the beamline components, causing particles to sputter. These particles may then enter the flow of ions passing through the beamline ion implantation system 100. However, these neutral particles are not affected by the magnetic field or the electric fields, and therefore cannot be controlled by the components in the beamline ion implantation system 100. For example, the neutral particles are not affected by the mass analyzer 106, the first acceleration or deceleration (A1 or D1) stage 108, or the second acceleration or deceleration (A2 or D2) stage 112, and can proceed to the workpiece 10.

Additionally, some negatively charged particles may also be created. For example, as ions strike a surface, these collisions may result in the emission of secondary electrons. These electrons may then collide with a particle, imparting a negative charge to the particle. Further, material that sputters from a negatively charged surface, such as a negatively charged electrode, may be negatively charged.

These negatively charged particles cannot be effectively controlled by the mass analyzer 106, the first acceleration or deceleration (A1 or D1) stage 108, or the second acceleration or deceleration (A2 or D2) stage 112. For example, a negatively charged particle will accelerate in a deceleration stage. Similarly, a negatively charged particle will decelerate in an acceleration stage.

In both of these cases, the particles do not have a positive charge, and therefore cannot be effectively controlled by the beamline components, or cannot be controlled at all. Therefore, it may be beneficial to control these non-positively charged particles as they travel in the beamline ion implantation system 100.

One approach to controlling these non-positively charged particles (i.e. neutral particles and negatively charged particles) is to ionize them, so that these particles behave like other ions in the beamline ion implantation system 100. This may be accomplished by exposing the non-positively charged particles to light having a wavelength sufficiently short so as to cause the neutral particle to lose an electron; or a negatively charged particle to lose several electrons, and become positive. In other words, upon exposure to an appropriate light source, the neutral particle will be ionized to form a positive ion and an electron. The negatively charged particle will be ionized to form a positive ion and at least two electrons. Both the positive ion and the electrons are susceptible to the magnetic and electrical fields within the beamline ion implantation system 100.

Figure 2:
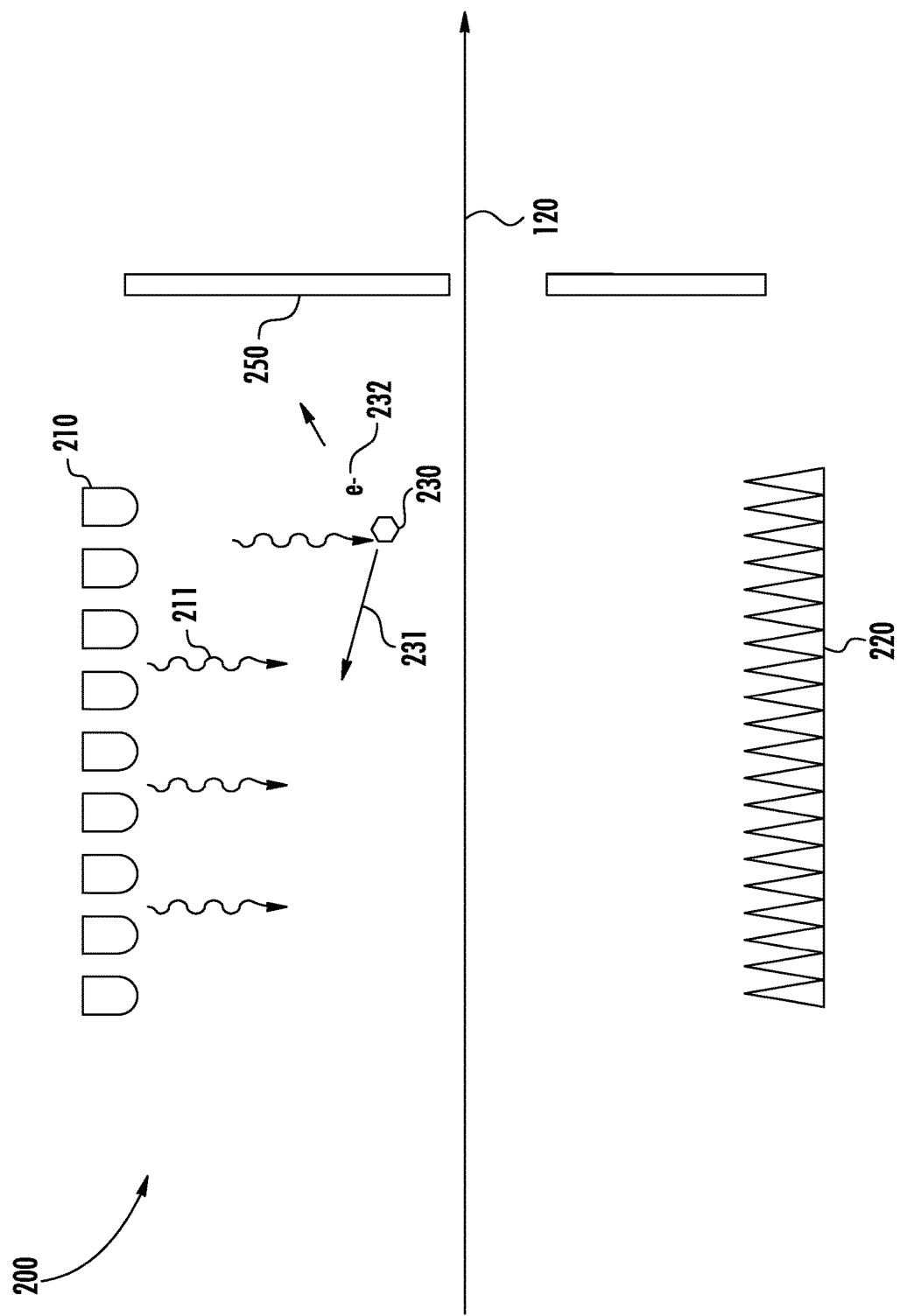
FIG. 2 is a light bath according to one embodiment.

FIG. 2 shows one embodiment of a light bath 200 that may be introduced in the beamline ion implantation system 100 of FIG. 1. This light bath 200 may be disposed anywhere along the path of the ion beam 120. In certain embodiments, the light bath 200 may be disposed proximate the workpiece 10, such that the number of non-positively charged particles generated after the light bath 200 is minimized. For example, in certain embodiments, the light bath may be disposed within the second acceleration or deceleration (A2 or D2) stage 112.

The light bath 200 comprises a light source 210. This light source 210 emits light 211 having a wavelength sufficiently short so as to photo-ionize the non-positively charged particles 230.

As is well known, each element has a work function, which is defined as the amount of energy needed to remove an electron from the element. Most elements have a work function between 2 eV and 6 eV. Additionally, it is known that the energy of a photon is given by $hc/\lambda$, where h is Planck's constant, c is the speed of light and $\lambda$ is the wavelength of the photon. A photon having a wavelength of about 200 nm will have an energy greater than 6 eV, and therefore would be able to ionize almost any element. Of course, if the neutral particles are of a known species, such as silicon (work function of 4.85 eV) or carbon (work function of 5 eV), a wavelength of 254.8 nm or 247.2 nm, respectively, may be used as these wavelengths are sufficiently short to ionize these particles. Thus, in certain embodiments, the light source 210 may comprise an ultraviolet light having a wavelength of less than about 250 nm. In certain embodiments, the wavelength may be less than or equal to 200 nm.

As the light 211 strikes a non-positively charged particle 230, an electron 232 is released, and the remaining portion of the formerly non-positively charged particle becomes a positively charged particle. If the light bath 200 is disposed in a deceleration stage where a positively biased electrode 250 is disposed downstream from the light bath 200, the positively charged particle will now experience a force 231 driving positively charged particle back upstream. This force 231 may be sufficient to push the positively charged particle upstream and away from the workpiece. The light bath 200 performs this function for both neutral particles and negatively charged particles.

In certain embodiments, the light bath 200 also comprises a light sink 220, also referred to as a light dump. The light sink 220 is disposed on the opposite side of the ion beam 120 so that the light 211 traverses the ion beam 120 before reaching the light sink 220. The light sink 220 serves to capture all or most of the light that traverses the ion beam 120. In this way, the light 211 does not reflect back toward the ion beam 120 a subsequent time.

Figure 3:
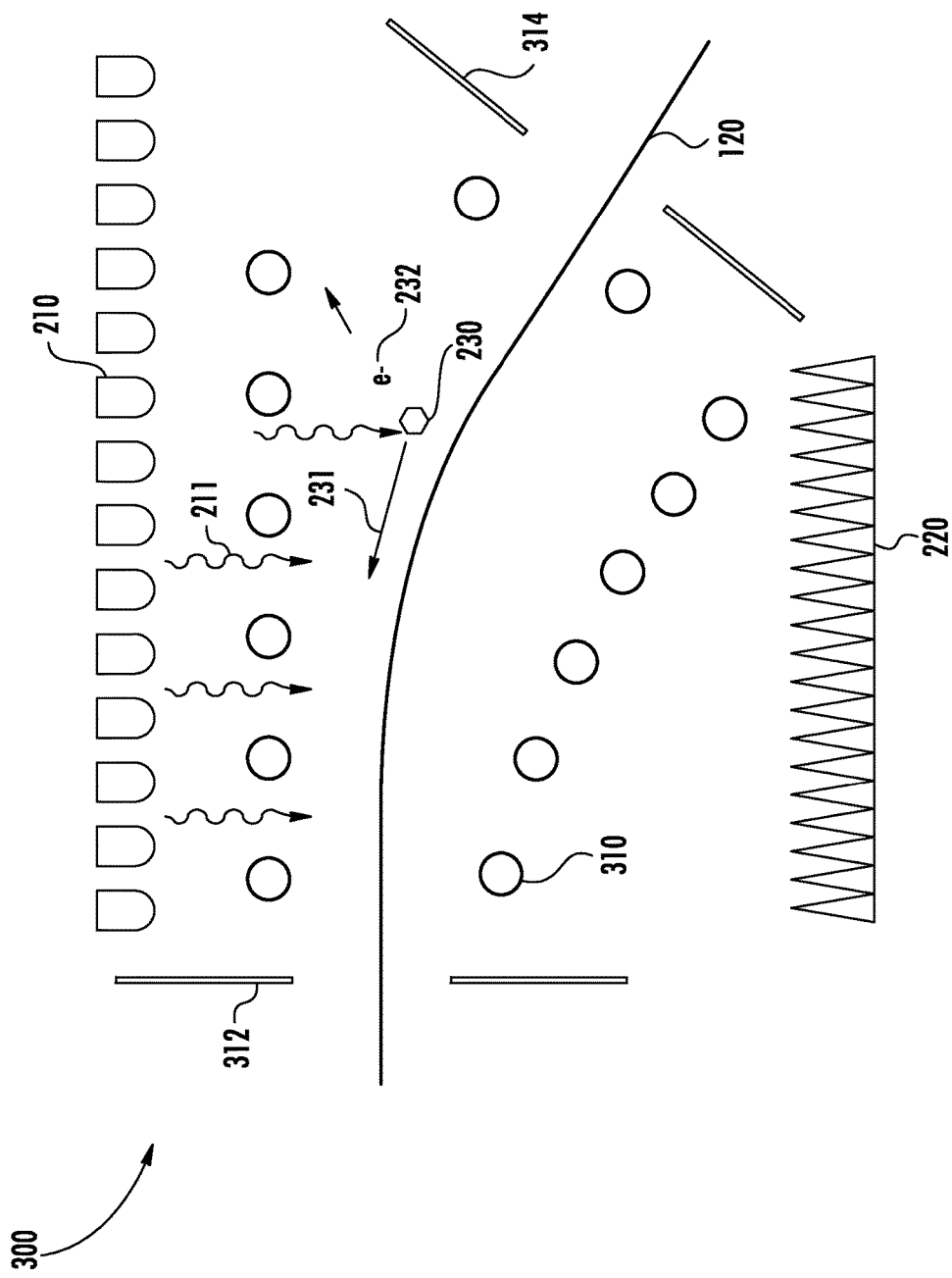
FIG. 3 is a light bath according to another embodiment.

As described above, the light bath 200 may be disposed within an existing component of the beamline ion implantation system 100. For example, in certain embodiments, the second acceleration or deceleration (A2 or D2) stage 112 may be a Vertical Electrostatic Energy Filter (VEEF). FIG. 3 shows a VEEF 300 with a light bath. The components of the light bath have been given identical reference designators. The VEEF 300 comprises a plurality of conductive focusing electrode 310, arranged as paired sets. The VEEF 300 may also comprise a set of entrance electrodes 312 and a set of exit electrodes 314. The entrance electrodes 312 and exit electrodes 314 may include two conductive pieces electrically coupled to each other or may be a one-piece structure with an aperture for the ion beam 120 to pass therethrough. In some embodiments, each pair of conductive focusing electrodes 310 may have different potentials in order to deflect and decelerate the ion beam 120 passing therethrough.

The light source 210 may be disposed within the VEEF 300. As described above, light 211 strikes the non-positively charged particles 230, changing them into positively charged particles and electrons 232. If the exit electrodes 314 are positively biased, the now positively charged particles will experience a force 231 in the upstream direction and will be decelerated. This may reduce the number of such particles that reach the workpiece.

Figure 4:
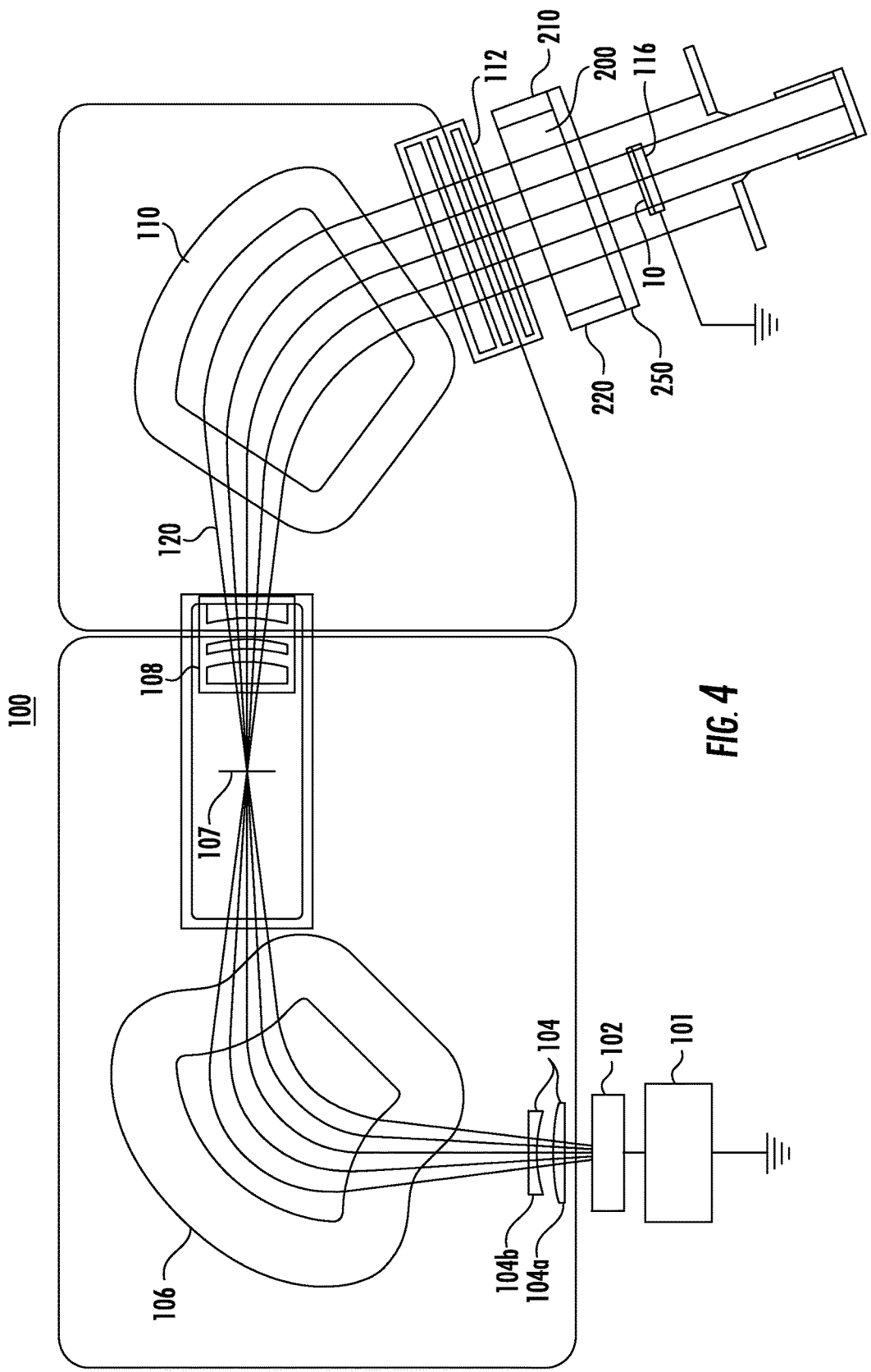
FIG. 4 is an ion implantation system in accordance with another embodiment.

In other embodiments, as shown in FIG. 4, the light bath 200 may be a new component that is not integrated into the beamline ion implantation system 100. For example, the light bath 200 and a deceleration electrode, which may be positively biased electrode 250, may be disposed at the output of the beamline ion implantation system 100. In this way, there are no new non-positively charged particles that are generated downstream from the light bath 200. Of course, while FIG. 4 shows the light bath 200 disposed between the beamline ion implantation system 100 and the workpiece 10, other embodiments are also possible. The light bath 200 may be disposed anywhere along the path of the ion beam 120.

The embodiments described above in the present application may have many advantages. As described above, as geometries get smaller, the effects of neutral particles on the performance and yield of the semiconductor devices are exacerbated. The light bath of the present disclosure allows the transformation of neutral particles into charged ions, which can then be controlled, like the other ions in the beamline ion implantation system. Similarly, the light bath allows transformation of negatively charged particles into positively charged particles. In certain embodiments, the light bath is integrated into an existing component, such as a deceleration stage, so that the deceleration stage performs the additional function of repelling the non-positively charged particles. Thus, the amount of added complexity and equipment is minimized. Finally, this light bath offers a way of reducing defects in the workpiece in a simple and cost-effective way.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for reducing an amount of non-positively charged particles in an ion beam, comprising:
a light source, disposed on one side of the ion beam and emitting light at a wavelength sufficiently short so as to ionize non-positively charged particles into positively charged particles; and
a positively biased electrode downstream from the light source, to repel the positively charged particles, wherein the ion beam is directed toward a workpiece after exposure to the light source.

2. The apparatus of claim 1, wherein the wavelength is less than 250 nm.

3. The apparatus of claim 1, wherein the wavelength is less than 200 nm.

4. The apparatus of claim 1, further comprising a light sink to absorb light emitted by the light source.

5. The apparatus of claim 4, wherein the light sink is disposed on an opposite side of the ion beam from the light source.

6. The apparatus of claim 1, wherein the non-positively charged particles comprise neutral particles.

7. The apparatus of claim 1, wherein the non-positively charged particles comprise negatively charged particles.

8. A beamline ion implantation system, comprising:
an ion source;
a deceleration stage comprising a positively biased electrode; and
a light bath disposed in the deceleration stage, the light bath comprising a light source, disposed upstream from the positively biased electrode, and emitting light at a wavelength sufficiently short so as to ionize non-positively charged particles into positively charged particles, wherein the ion beam is directed toward a workpiece after exposure to the light source.

9. The beamline ion implantation system of claim 8, wherein the non-positively charged particles comprise silicon.

10. The beamline ion implantation system of claim 8, wherein the non-positively charged particles comprise carbon.

11. The beamline ion implantation system of claim 8, wherein the light bath further comprises a light sink disposed on an opposite side of an ion beam from the light source.

12. The beamline ion implantation system of claim 8, wherein the wavelength is less than 250 nm.

13. The beamline ion implantation system of claim 8, wherein the deceleration stage comprises a Vertical Electrostatic Energy Filter.

14. A beamline ion implantation system, comprising:
an ion source;
one or more components utilizing magnetic or electrical fields to manipulate an ion beam; and
a light bath comprising a light source and emitting light at a wavelength sufficiently short so as to ionize non-positively charged particles in the ion beam into positively charged particles, so that the positively charged particles are manipulated by at least one of the one or more components, and wherein the ion beam is directed toward a workpiece after exposure to the light source.

15. The beamline ion implantation system of claim 14, wherein the positively charged particles are manipulated by a positive electrical field.

16. The beamline ion implantation system of claim 14, wherein the light bath further comprises a light sink disposed on an opposite side of the ion beam from the light source.

17. The beamline ion implantation system of claim 14, wherein the wavelength is less than 250 nm.

18. The beamline ion implantation system of claim 14, wherein the non-positively charged particles comprise neutral particles.

19. The beamline ion implantation system of claim 14, wherein the non-positively charged particles comprise negatively charged particles.

\* \* \* \* \*